(12) United States Patent
Song

(10) Patent No.: US 6,466,615 B1
(45) Date of Patent: Oct. 15, 2002

(54) DELAY LOCKED LOOP BASED CIRCUIT FOR DATA COMMUNICATION

(75) Inventor: Hongjiang Song, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,486

(22) Filed: Dec. 30, 1999

(51) Int. Cl.[7] .................................................. H03H 7/40
(52) U.S. Cl. ...................... 375/232; 375/350; 708/313; 708/316; 708/322; 341/141; 341/142; 341/159
(58) Field of Search .................. 375/229, 230, 375/232, 233, 245, 247, 340, 346, 348, 350; 708/300, 313, 316, 322, 323; 341/129, 141, 142, 159, 164, 165, 168, 169

(56) References Cited

U.S. PATENT DOCUMENTS

| | | | | |
|---|---|---|---|---|
| 5,519,398 A | * | 5/1996 | Satoh et al. ................. 341/159 |
| 5,617,090 A | * | 4/1997 | Ma et al. ..................... 341/118 |
| 5,768,322 A | * | 6/1998 | Nishizawa et al. ........... 327/74 |
| 6,061,396 A | * | 5/2000 | Everitt ......................... 375/233 |
| 6,289,062 B1 | * | 9/2001 | Wang et al. ................. 375/232 |
| 6,313,882 B1 | * | 11/2001 | Limberg et al. ............ 348/614 |
| 6,362,760 B2 | * | 3/2002 | Kober et al. ................ 341/141 |

* cited by examiner

Primary Examiner—Stephen Chin
Assistant Examiner—Dac V. Ha
(74) Attorney, Agent, or Firm—Blakley, Sokoloff, Taylor & Zafman LLP

(57) ABSTRACT

An apparatus including a plurality of quantizers each configured to compare a selected threshold signal with an input signal and generate an output, a multiplexer, coupled to the plurality of quantizers, that selects one of the plurality of quantizer outputs according to a frequency response, and a multiplication-accumulation (MAC) unit, coupled to the multiplexer, the MAC to generate an output based on a previously selected one of the quantizer outputs according to the frequency response.

17 Claims, 5 Drawing Sheets

DELAY LOCKED LOOP BASED CIRCUIT FOR DATA COMMUNICATION

FIELD OF THE INVENTION

The invention relates to equalization of high speed digital communication channels using a threshold multiplexing feedback digital filter.

BACKGROUND

In high speed digital communication systems, communication channels often suffer from intersymbol interference (ISI). In such systems, coherent detection and equalization are necessary to achieve satisfactory performance. Equalizations are typically done using either linear digital filters such as finite impulse response (FIR) filters or non-linear digital filters such as decision feedback equalization (DFE) filters. Equalization can also be done using analog filters before sampling occurs.

Theoretically, FIR filters can be used to approximate any time-invariant impulse response. with a large number of taps. The DFE's, which remove both pre- and post-cursor ISI using a feedforward FIR filter. followed by a feedback infinite impulse response (IIR) filter and a decision non-linearity, are reported to have better equalization results. However, most digital equalizers reported so far are very expensive to implement in very large scale integration (VLSI) systems due to the requirements of large device and silicon area count for high throughput data processing and high speed analog to digital (A/D) conversion. The analog equalizer solutions, on the other hand, can be used to significantly reduce the equalizer device count. However, they suffer from poor design flexibility, reusability, testability, and manufacturability properties of the analog VLSI circuits.

SUMMARY

In accordance with the invention, there is disclosed an apparatus including a plurality of quantizers each configured to compare a selected threshold signal with an input signal and generate an output, a multiplexer, coupled to the plurality of quantizers, that selects one of the plurality of quantizer outputs according to a frequency response, and a multiplication-accumulation (MAC) unit, coupled to the multiplexer, the MAC to generate an output based on a previously selected one of the quantizer outputs according to the frequency response.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

A method and apparatus pertaining to equalization of high speed digital communication channels using threshold multiplexing feedback digital filter is described. In one embodiment, a digital equalizer based on a feedback threshold multiplexing IIR filter structure is presented. An A/D converter is not required for this equalizer because a parallel quantization mechanism is included in the digital filter itself. In addition, only two-level data from the delayed output sequence are needed for the feedback data processing. Consequently, this equalizer can be implemented in a smaller area and operated at higher speed than prior art configurations, and is very suitable for low cost VLSI circuit realization.

Figure 1:
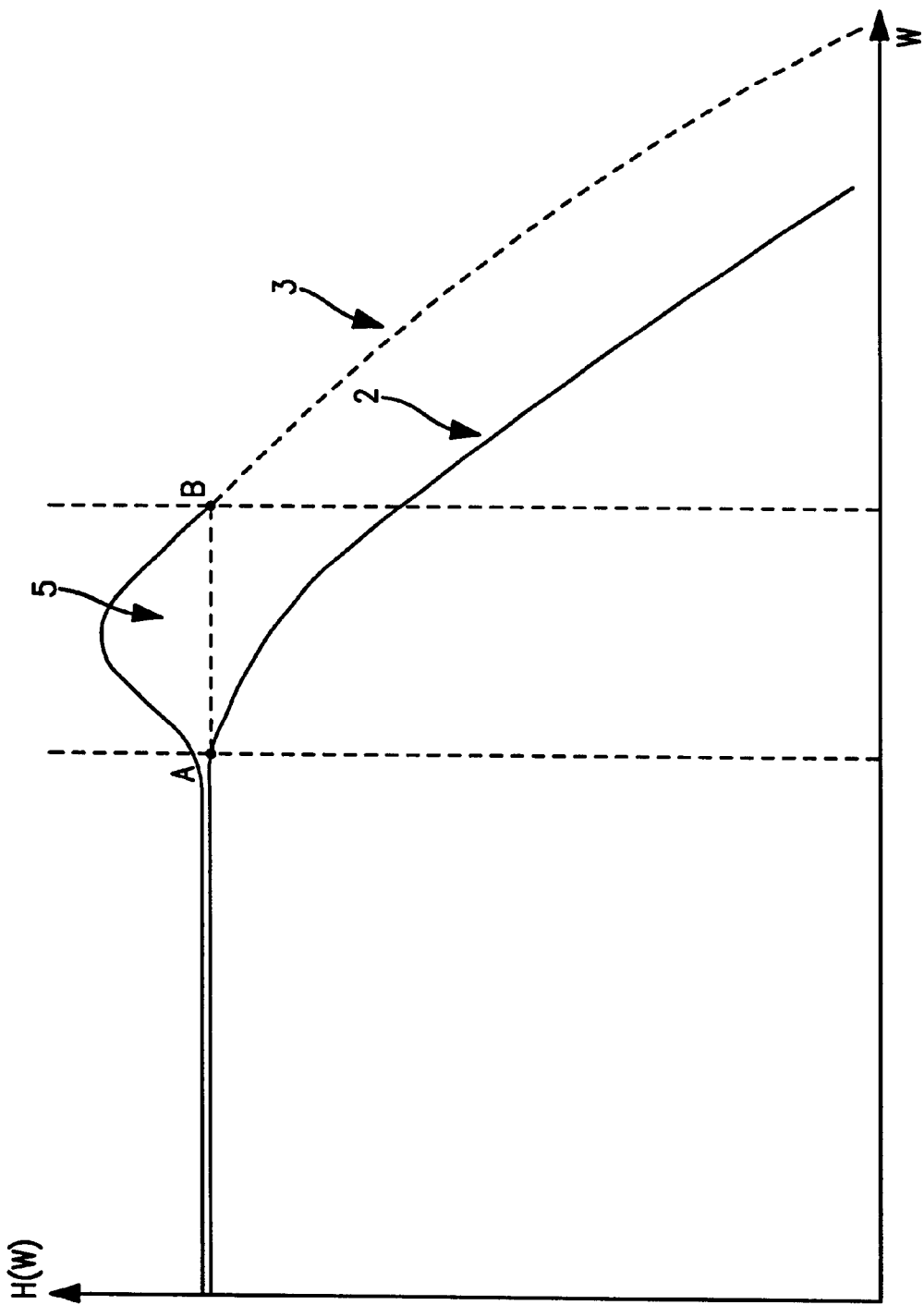
FIG. 1 is graphical representation or bode plot of frequency response H(w) plotted versus frequency (w)

In one aspect, the invention is concerned with retrieving communication signals over a communication line, such as a communication cable. FIG. 1 shows a graphical representation or bode plot of frequency response H(w) plotted versus frequency (w). In order to resemble an ideal cable where the impedance is matched and the slew rate is adjusted, it is necessary to increase the bandwidth of the cable. This can be achieved by using a high-pass filter which will vary attenuation 5 of frequency response 2, as shown in FIG. 1. As a result, the bandwidth will increase from point A to point B, to form frequency response 3, as shown in FIG. 1.

In this invention, a digital equalizer based on a feedback threshold multiplexing IIR filter structure is presented. The general form of the difference equation for the IIR system is given by:

$$y_k = x_k - v_{th}(c_1 y_{k-1} + c_2 y_{k-2} + \ldots + c_n y_{k-n}) \equiv x_k - a_1 y_{k-1} - a_2 y_{k-2} - \ldots - a_n y_{k-n} \quad (1)$$

This equation relates the present output value with present values of the input and the present and past values of the output. Thus, the filtering process involves a recursive process using present and past values of the input. In equation (1), "y" represents the output signal, "x" represents the input signal, "c" represents a coefficient selected according to the frequency response desired, and "$a_n$" represents an order coefficient representative of the frequency response where "n" is the order of the frequency response.

Figure 2:
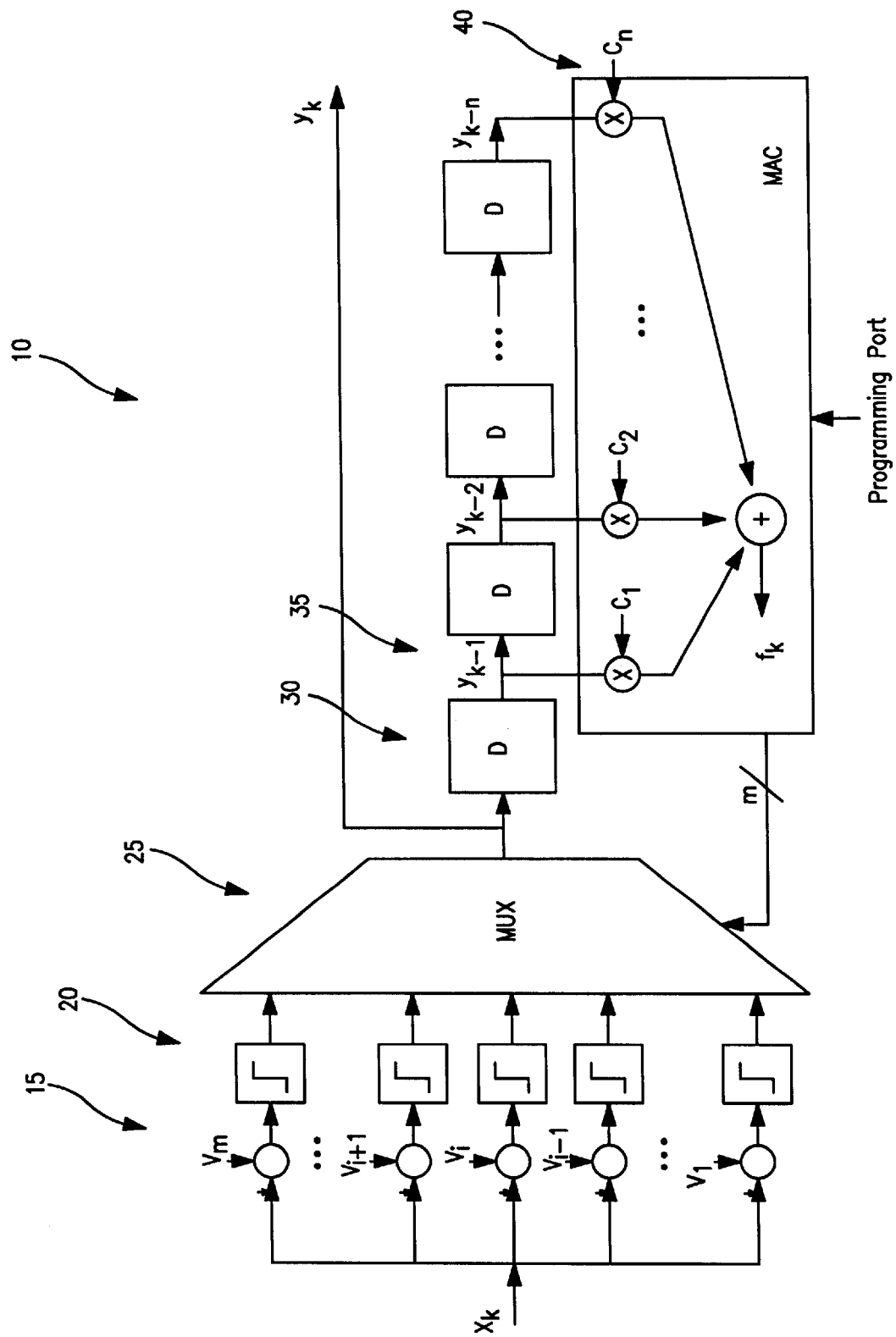
FIG. 2 is a schematic diagram of a threshold multiplexing feedback digital equalizer architecture in accordance with an embodiment of the invention.

FIG. 2 schematically illustrates an embodiment of a threshold multiplexing feedback digital equalizer according to the invention. As shown in FIG. 2, equalizer 10 consists of parallel quantizer 20, multiplexer 25, digital delay line 35, and programmable multiplication-accumulation (MAC) unit 40. The ISI distorted signal $\{x_k\}$, introduced into equalizer 10, is directly quantified by "m" parallel single-bit quantizers 20 with dedicated quantization thresholds $\{v_i, =1, 2, \ldots m\}$ 15. Parallel quantizers 20 are, for example, comparators that function as 1-bit A/D converters because they recognize a two-level sequence, either high or low. The "m" two-level sequences are filtered using "m-to-1" multiplexer 25 to generate the two-level output sequence (either high or low).

The input signal $\{x_k\}$ is an analog signal and a different threshold signal $\{v_i\}$ 15 is associated with each quantizer 20 and comprises a value selected to be within the range of the input signal. For example, if the input signal $\{x_k\}$ is 1V, then the equally spaced threshold signals will range from −1V to +1V or −½V to +½V, etc.

Each of the plurality of quantizers 20 comprises a comparator that subtracts threshold signal $\{v_i\}$ 15 from input signal $\{x_k\}$ to generate a representative digital output corresponding to whether threshold signal $\{v_i\}$ 15 is greater than or less than input signal $\{x_k\}$. In this embodiment, if threshold signal $\{v_i\}$ 15 is less than input signal $\{x_k\}$, then the representative digital output is high.

The output sequence which represents the complete history (past values) of the digital output signal, is obtained using flip-flops 30 on digital delay line 35 to delay each output signal by one clock cycle. The delayed two-level output data are used to create the control sequence of multiplexer 25 through MAC 40 and the outputs $\{f_k\}$ of MAC 40 are decoded such that at each sampling point there is a proportional mapping between "$f_k$" and the threshold "$v_i$" of the selected quantified output.

Figure 3:
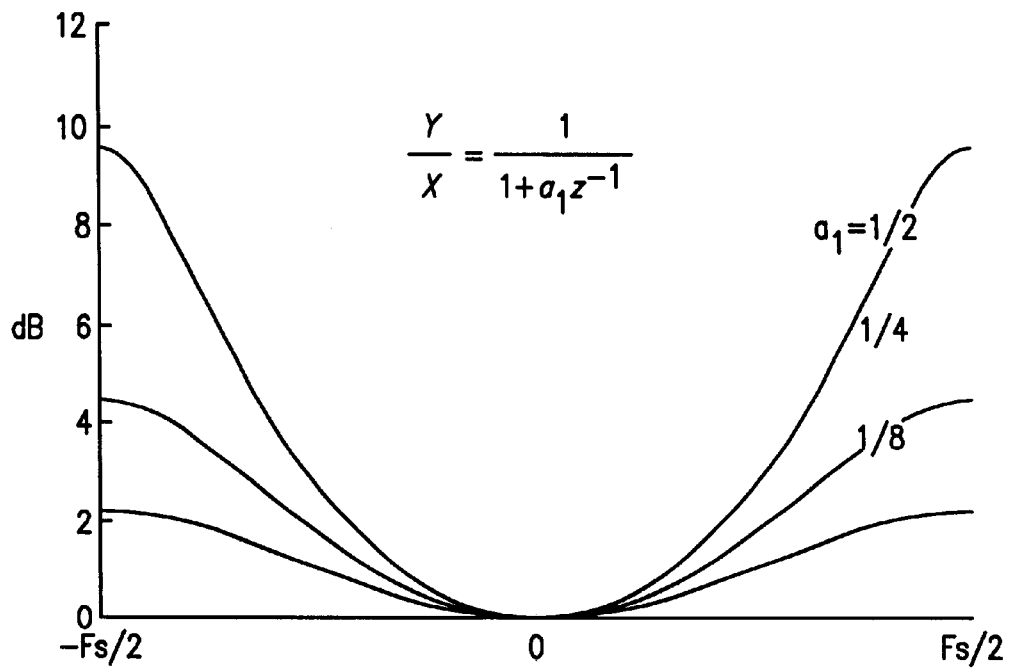
FIG. 3 illustrates a $1^{st}$ order IIR filter frequency response in accordance with an embodiment of the invention.
Figure 4:
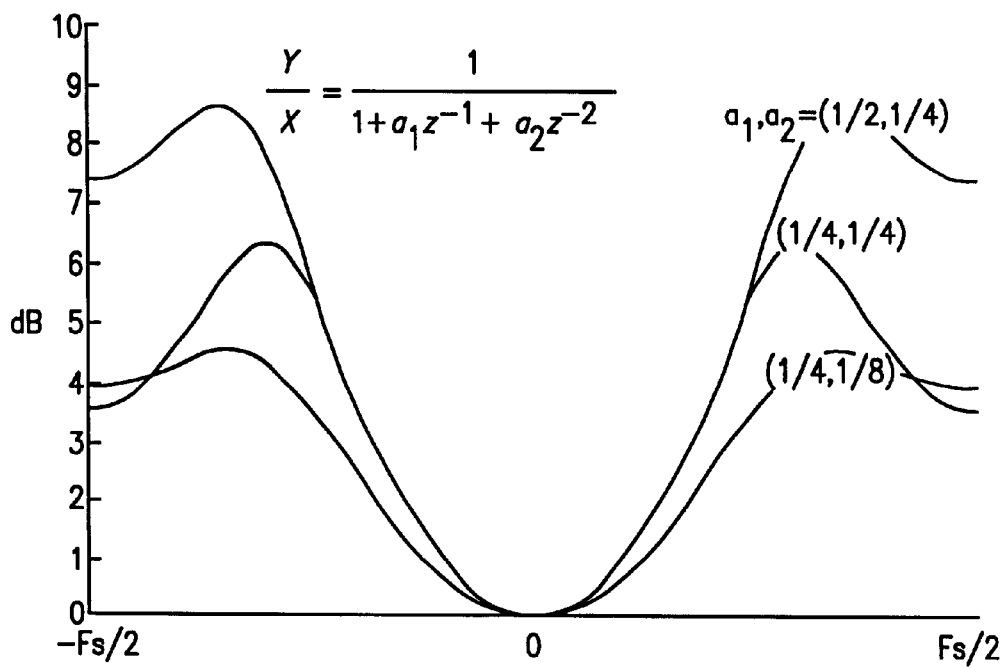
FIG. 4 illustrates a $2^{nd}$ order IIR filter frequency response in accordance with an embodiment of the invention.
Figure 5:
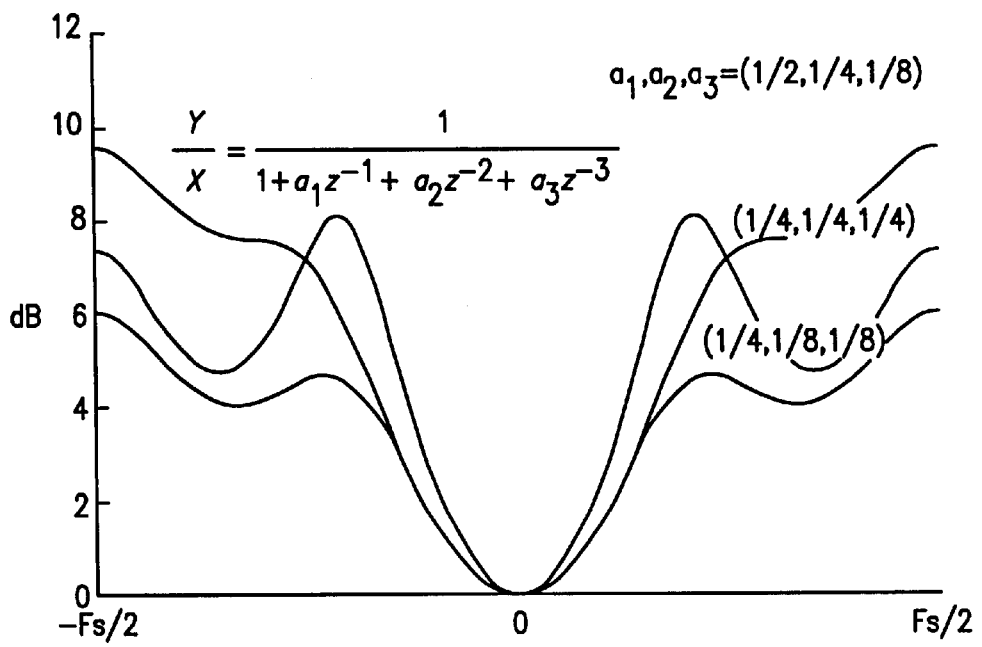
FIG. 5 illustrates a $3^{rd}$ order IIR filter frequency response in accordance with an embodiment of the invention.
Figure 6:
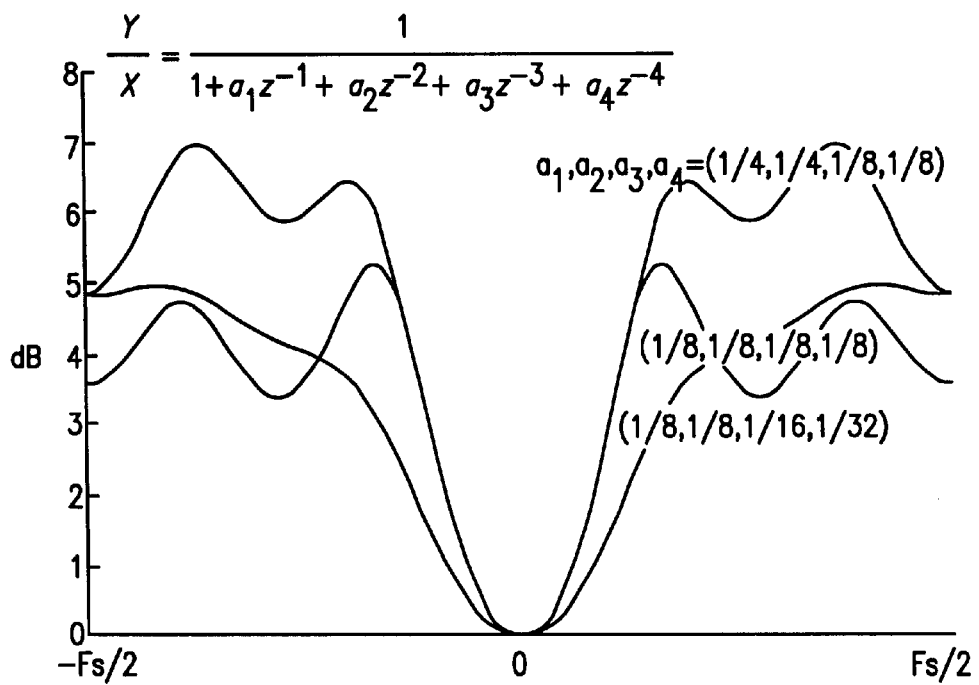
FIG. 6 illustrates a $4^{th}$ order IIR filter frequency response in accordance with an embodiment of the invention.

FIGS. 3, 4, 5, and 6 show several normalized filter frequency responses of filter expressed by equation (1) for some simple MAC 40 coefficient sets. As can be seen, a wide range of frequency responses can be constructed even with a limited number of feedback taps. FIG. 3 illustrates three different $1^{st}$ order frequency responses, according to three different values for "$a_1$." FIG. 4 illustrates three different $2^{nd}$ order frequency responses, according to three sets of values for "$a_1$" and "$a_2$". FIG. 5 illustrates three different $3^{rd}$ order frequency responses, according to three sets of values for "$a_1$", "$a_2$", and "$a_3$". Finally, FIG. 6 illustrates three different $4^{th}$ order frequency responses, according to three sets of values for "$a_1$", "$a_2$", "$a_3$" and "$a_4$".

MAC 40 multiplies the individual outputs by their respective coefficients $c_n$ and sums these outputs. The c coefficients are selected according to the frequency response desired since $(v_{th} * c_n = a_n)$ where "n" represents the order of the frequency response, $v_{th}$ the selected threshold signal, and $a_n$ an order coefficient representative of the frequency responses.

Multiplexer 25 selects one of the plurality of quantizer outputs according to the output generated from MAC unit 40. Mathematically, this proportional mapping is equivalent to generating an output sequence by subtracting a value which is proportional to MAC 40 output from the input sequence:

$$y_k = x_k - v_{th}(c_1 y_{k-1} + c_2 y_{k-2} + \ldots + c_n y_{k-n}) \equiv x_k - a_1 y_{k-1} - a_2 y_{k-2} - \ldots - a_n y_{k-n} \quad (1)$$

Varying the quantization thresholds $\{V_i\}$ 15 or $c_n$, will provide desired coefficients "$a_n$", which will in turn provide the frequency response desired, as explained above. This filter is non-linear because of in-loop quantization. An IIR digital filter can approximate the characteristics of equalizer 10 with the z-domain transfer function as:

$$\frac{y}{x} \approx \frac{1}{1 + a_1 z^{-1} + a_2 z^{-2} + \ldots + a_n z^{-n}} \quad (2)$$

By performing the following steps on equation (1), equation (2) can be obtained:

$$y_k = x_k - a_1 y_{k-1} - a_2 y_{k-2} - \ldots - a_n y_{k-n} \quad (1)$$

$$y(z) = x(z) - a_1 y(z) z^{-1} - a_2 y(z) z^{-2} - \ldots - a_n y(z) z^{-n}$$

$$\frac{y(z)}{y(z)} = \frac{x(z) - a_1 y(z) z^{-1} - a_2 y(z) z^{-2} - \ldots - a_n y(z) z^{-n}}{y(z)} \quad (2)$$

$$1 = \frac{x(z)}{y(z)} - a_1 z^{-1} - a_2 z^{-2} - \ldots - a_n z^{-n}$$

$$\frac{x(z)}{y(z)} = 1 + a_1 z^{-1} + a_2 z^{-2} + \ldots + a_n z^{-n}$$

$$\frac{y(z)}{x(z)} = \frac{1}{1 + a_1 z^{-1} + a_2 z^{-2} + \ldots + a_n z^{-n}}$$

Figure 7:
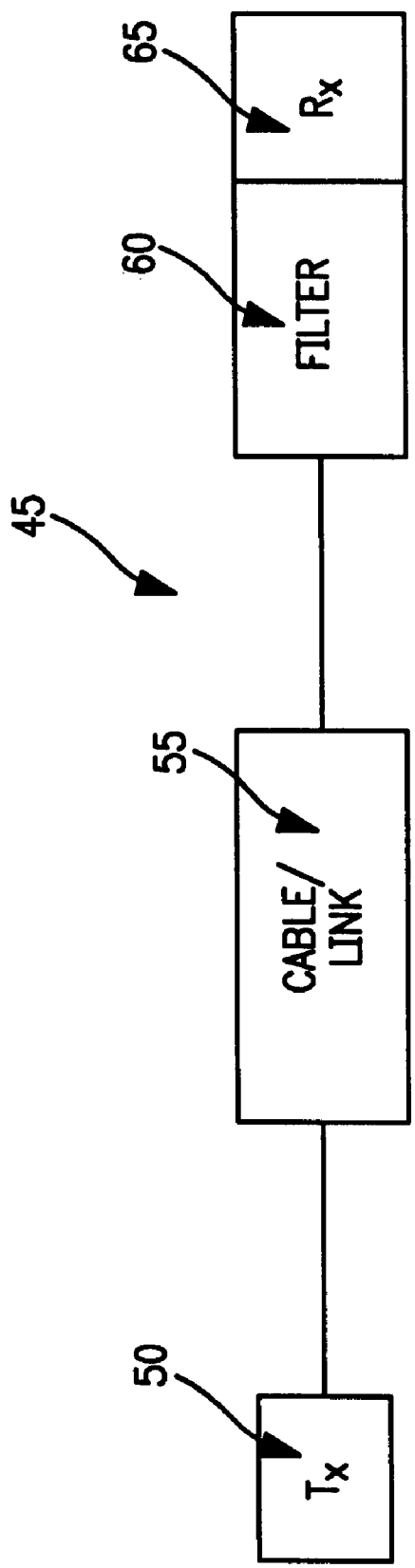
FIG. 7 is a general block diagram of a communication system wherein a second communication terminal comprises a filter which converts the analog voiceband signal into digital baseband data, in accordance with an embodiment of the invention.

FIG. 7 is a general block diagram that illustrates a communication system 45 suitable for an implementation of the equalizer of the invention. System 45 can be implemented as part of a communication link between a transmitting signal and a receiving signal, such as in a Community Access Television (CATV) network, the Public Switched Telephone Network (PSTN), the Integrated Services Digital Network (ISDN), the Internet, a local area network (LAN), a wide area network (WAN), over a wireless communications network, or over an asynchronous transfer mode (ATM) network. System 45 includes a first communication terminal 50 for providing information carried by analog voiceband signals, communication link 55 coupled to first communication terminal 50, where the cable may be, for example, electrical or fiber optic, and second communication terminal 65 for receiving the analog voiceband signals from first communication terminal 50 via communication link 55. Second communication terminal 65 comprises filter 60 which converts the analog voiceband signals into digital baseband data. Filter 60 is for example the equalizer described above.

Equalizer architecture 10 has several attractive properties. First, the IIR feedback implementation uses a parallel quantization and multiplexing technique, which improves the data throughput, eliminates the A/D converter and simplifies the design. Second, the use of an IIR-model instead of a FIR-model with two-level sequential feedback allows achieving high frequency gain with a simpler structure. Third, all critical circuit components may be operated in two-level or digital signal mode, and their function does not directly rely on the device parasitic parameters, which makes the equalizer performance scales the same with the conventional digital circuits. Consequently, the circuit implementation is reusable and can be directly integrated onto chips.

Since this equalizer is based on the digital-based-analog (DBA) design concept, it will be able to achieve higher design and manufacture efficiency at lower development cost. In one example, an equalizer based on this equalization architecture was developed and a high speed link simulation using the IEEE 1394–1995 Standard, IEEE std. 1394–1995, published Aug. 30, 1996, cable model shows that this equalization method may be used to extend the data speed to the one gigabyte per second (1 Gbt/s) level.

What is claimed is:

1. An apparatus comprising:
    a plurality of quantizers each configured to compare a selected threshold signal with an input signal and generate an output;
    a multiplexer, coupled to the plurality of quantizers, that selects one of the plurality of quantizer outputs according to a frequency response; and
    a multiplication-accumulation (MAC) unit, coupled to the multiplexer, the MAC to generate an output based on a previously selected one of the quantizer outputs according to the frequency response.

2. The apparatus of claim 1, wherein the input signal is an analog signal and a different threshold signal is associated with each quantizer and comprises a value selected to be within the range of the input signal.

3. The apparatus of claim 2, wherein the different threshold signals are equally spaced within the range of the input signal.

4. The apparatus of claim 2, wherein each of the plurality of quantizers comprises a comparator that subtracts the threshold signal from the input signal to generate a representative digital output corresponding to whether the threshold signal is greater than or less than the input signal.

5. The apparatus of claim 4, wherein the representative digital output is a high when the threshold signal is less than the input signal.

6. The apparatus of claim 2, further comprising a delay line having a plurality of flip-flops configured sequentially where each of the plurality of flip flops delays the multiplexer output one clock cycle.

7. The apparatus of claim 6, wherein the MAC unit multiplies each delayed output by a coefficient $c_n$, where n is the number of flip flops representative of the frequency response.

8. The apparatus of claim 7, wherein the coefficients $c_n$ are determined by the equation:

$$c_n = \frac{a_n}{v_{th}}$$

where $a_n$ represents an order coefficient representative of the frequency response, n represents the order of the frequency response and $v_{th}$ the selected threshold signal.

9. The apparatus of claim 7, wherein the MAC unit generates an output from the sum of all the delayed outputs multiplied by their respective coefficients, $c_n$.

10. The apparatus of claim 9, wherein the multiplexer selects one of the plurality of quantizer outputs according to the output generated from the MAC unit.

11. The apparatus of claim 1, wherein the output sequence generated by the MAC unit based on a previously selected one of the quantizer outputs according to the frequency response, can be represented by the equation:

$$y_k = x_k - v_{th}(c_1 y_{k-1} + c_2 y_{k-2} + \ldots + c_n y_{k-n}) \equiv x_k - a_1 y_{k-1} - a_2 y_{k-2} - \ldots - a_n y_{k-n}.$$

12. A method for generating an output from an infinite impulse response (IIR) filter comprising:

configuring a plurality of quantizers to compare a selected threshold signal with an input signal and generate an output;

selecting one of a plurality of quantizer outputs according to a frequency response; and generating a selection output to select one of the plurality of quantizer outputs based on a previously selected one of the quantizer outputs according to the frequency response.

13. The method of claim 12, further comprising:

configuring the plurality of quantizers to subtract the threshold signal from the input signal to generate a representative digital output corresponding to whether the threshold signal is greater than or less than the input signal.

14. The method of claim 12, wherein generating a selection output comprises delaying the selected one of the plurality of quantizers outputs, generated from the multiplexer, by at least one cycle.

15. The method of claim 14, wherein generating a selection output comprises multiplying the delayed output by a coefficient $c_n$ where n is a selected order of the frequency response.

16. The method of claim 14, wherein generating a selection output further comprises accumulating as a sum all of the delayed outputs multiplied by their respective coefficients.

17. A communication system comprising:

a first communication terminal coupled to provide information carried by an input signal;

a communication link coupled to the first communication terminal;

a second communication terminal coupled to provide the input signal from said first communication terminal via said communication link, the second communication terminal comprising a filter, which converts the input signal into digital baseband data comprising:

a plurality of quantizers each configured to compare a selected threshold signal with an input signal and generate an output;

a multiplexer that selects one of the plurality of quantizer outputs according to a frequency response; and a multiplication-accumulation (MAC) unit that generates an output based on a previously selected one of the quantizer outputs according to the frequency response.

* * * * *